United States Patent
Choi et al.

(10) Patent No.: US 10,217,958 B2
(45) Date of Patent: Feb. 26, 2019

(54) METHOD OF MANUFACTURING CURVED DISPLAY DEVICE

(71) Applicant: Samsung Display Co., Ltd., Yongin-si, Gyeonggi-do (KR)

(72) Inventors: Jinhwan Choi, Yongin-si (KR); Jintaek Kim, Yongin-si (KR); Taewoong Kim, Yongin-si (KR); Boik Park, Yongin-si (KR); Juchan Park, Yongin-si (KR); Taean Seo, Yongin-si (KR); Younggug Seol, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 17 days.

(21) Appl. No.: 15/334,137

(22) Filed: Oct. 25, 2016

(65) Prior Publication Data
US 2017/0117501 A1    Apr. 27, 2017

(30) Foreign Application Priority Data

Oct. 27, 2015   (KR) .................. 10-2015-0149721

(51) Int. Cl.
*B29L 31/34*      (2006.01)
*H01L 27/32*      (2006.01)
(Continued)

(52) U.S. Cl.
CPC ...... *H01L 51/5246* (2013.01); *B29C 63/0004* (2013.01); *B29C 63/0047* (2013.01);
(Continued)

(58) Field of Classification Search
CPC ............ B29C 65/50; B29L 2031/3475; H01L 2227/323; H01L 2251/5338;
(Continued)

(56) References Cited

U.S. PATENT DOCUMENTS 3,461,583 A * 8/1969 Buck .................. G09F 3/10
                                                              40/595
4,668,314 A * 5/1987 Endoh ............. G06F 15/0216
                                                              156/267
(Continued)

FOREIGN PATENT DOCUMENTS

KR    10-2014-0148176 A    12/2014
KR    10-2015-0048547 A     5/2015
(Continued)

OTHER PUBLICATIONS

English transkation of KR2014-0148176.*
(Continued)

*Primary Examiner* — Sonya M Sengupta
(74) *Attorney, Agent, or Firm* — Lewis Roca Rothgerber Christie LLP

(57) ABSTRACT

A method of manufacturing a curved display device is disclosed. In one aspect, the method includes providing a frame, providing a flexible display panel and attaching a first area of the flexible display panel to the frame. The method also includes attaching a second area of the flexible display panel to the frame, wherein the providing of the flexible display panel comprises attaching a release paper to a surface of the flexible display panel, the release paper comprising first and second release areas respectively corresponding to the first and second areas of the flexible display panel. The method further includes removing the first release area from the flexible display panel before attaching the first area and removing the second release area from the flexible display panel before attaching the second area.

21 Claims, 5 Drawing Sheets

(51) Int. Cl.
    *H01L 51/00*     (2006.01)
    *H01L 51/52*     (2006.01)
    *H01L 51/56*     (2006.01)
    *B29C 65/50*     (2006.01)
    *B29C 63/00*     (2006.01)
    *G02F 1/1333*     (2006.01)

(52) U.S. Cl.
    CPC ...... *B29C 63/0073* (2013.01); *B29C 63/0095* (2013.01); *B29C 65/50* (2013.01); *H01L 51/003* (2013.01); *H01L 51/56* (2013.01); *B29L 2031/3475* (2013.01); *G02F 1/133308* (2013.01); *G02F 2001/133325* (2013.01); *H01L 27/3244* (2013.01); *H01L 2227/323* (2013.01); *H01L 2251/5338* (2013.01)

(58) Field of Classification Search
    CPC ............... H01L 27/3244; H01L 51/003; H01L 51/5246; H01L 51/56; G02F 2001/133325; G02F 1/133308
    See application file for complete search history.

(56) References Cited

U.S. PATENT DOCUMENTS

| | | | | |
|---|---|---|---|---|
| 4,914,842 | A * | 4/1990 | Lieberman | A47G 1/0633 156/249 |
| 5,111,579 | A * | 5/1992 | Andersen | B29C 43/203 156/222 |
| 5,303,489 | A * | 4/1994 | Blegen | G09F 1/12 40/600 |
| 5,352,314 | A * | 10/1994 | Coplan | B44C 1/162 156/234 |
| 2011/0104973 | A1* | 5/2011 | Wang | G02F 1/133305 445/22 |
| 2012/0076967 | A1* | 3/2012 | Muramatsu | C09J 7/0232 428/41.8 |
| 2013/0002583 | A1* | 1/2013 | Jin | G06F 1/1637 345/173 |
| 2015/0165477 | A1* | 6/2015 | Yamazaki | B05D 1/36 427/535 |
| 2015/0194996 | A1* | 7/2015 | Roberts | B29C 63/02 455/575.8 |
| 2015/0261259 | A1* | 9/2015 | Endo | G06F 1/1652 361/679.06 |

FOREIGN PATENT DOCUMENTS

| | | |
|---|---|---|
| KR | 10-2015-0068613 A | 6/2015 |
| KR | 10-2015-0077164 A | 7/2015 |

OTHER PUBLICATIONS

English transkation of KR2015-0048547.*
English transkation of KR2015-0068613.*
English transkation of KR2015-0077164.*

* cited by examiner

METHOD OF MANUFACTURING CURVED DISPLAY DEVICE

CROSS-REFERENCE TO RELATED APPLICATION

This application claims the benefit of Korean Patent Application No. 10-2015-0149721, filed on Oct. 27, 2015, in the Korean Intellectual Property Office, the disclosure of which is incorporated herein in its entirety by reference.

BACKGROUND

Field

The described technology generally relates to a method of manufacturing a curved display device.

Description of the Related Technology

Organic light-emitting diode (OLED) displays are self-emissive, and considered to be a next-generation display due to their desirable characteristics such as a wide viewing angle, high contrast ratio, quick response times, and excellent contrast.

Research and development are actively being conducted to create various forms of display devices that are mounted on electronic devices.

SUMMARY OF CERTAIN INVENTIVE ASPECTS

One inventive aspect relates to a method of manufacturing a curved display device.

Another aspect is a method of manufacturing a curved display device that includes preparing a frame; preparing a flexible display panel; arranging the flexible display panel on the frame; first attaching a first area of the flexible display panel on the frame; and secondly attaching a second area of the flexible display panel on the frame. The preparing of the flexible display panel includes attaching a release paper on a surface of the flexible display panel, the release paper including a first release area corresponding to the first area and a second release area corresponding to the second area. Before the first attaching the first area on the frame, the first release area of the release paper from the flexible display panel is removed, and before the secondly attaching the second area on the frame, the second release area of the release paper from the flexible display panel is removed.

The first release area and the second release area may be divided by a cutting line.

The preparing of the frame may include forming a first adhesive layer on the frame.

The preparing of the flexible display panel may include, before attaching the release paper, forming a second adhesive layer on the surface of the flexible display panel.

The flexible display panel may be attached to the frame by the first and second adhesive layers.

The method may further include, before the removing the first release area, attaching a fixing tape on the second area of the flexible display panel.

The fixing tape may be attached to a portion of the frame outside the flexible display panel and may fix a location of the flexible display panel.

The fixing tape may be parallel to the cutting line.

The method may further include, before the removing the second release area of the release paper, removing the fixing tape.

The frame may include at least one curved portion, and the at least one curved portion is convex toward the flexible display panel.

Another aspect is a method of manufacturing a curved display device that includes preparing a frame including at least one curved portion that is convex toward an external area; attaching a release paper on a surface of a flexible display panel, the release paper including a first release area and a second release area are divided by a cutting line; arranging the flexible display panel on the frame such that the release paper faces toward the frame; fixing a location of the flexible display panel by attaching a fixing tape on the flexible display panel; removing the first release area and first attaching a first area of the flexible display panel on the frame; and removing the fixing tape and the second release area and secondly attaching a second area of the flexible display panel on the frame.

The method may further include forming a first adhesive layer on the at least one curved portion.

The method may further include, before the attaching the release paper, forming a second adhesive layer on the surface of the flexible display panel.

The flexible display panel may be attached to the frame by the first and second adhesive layers.

The fixing tape may be attached on the second area.

The fixing tape may be attached to a portion of the frame outside the flexible display panel and may fix a location of the flexible display panel.

The fixing tape may be parallel to the cutting line.

Another aspect is a method of manufacturing a curved display device, the method comprising: providing a frame; providing a flexible display panel; attaching a first area of the flexible display panel to the frame; attaching a second area of the flexible display panel to the frame, wherein the providing of the flexible display panel comprises attaching a release paper to a surface of the flexible display panel, the release paper comprising first and second release areas respectively corresponding to the first and second areas of the flexible display panel; removing the first release area from the flexible display panel before attaching the first area; and removing the second release area from the flexible display panel before attaching the second area.

In the above method, the first and second release areas are divided by a cutting line. In the above method, the providing of the frame comprises forming a first adhesive layer over the frame. In the above method, the providing of the flexible display panel comprises, before attaching the release paper, forming a second adhesive layer over the surface of the flexible display panel. In the above method, the flexible display panel is attached to the frame via the first and second adhesive layers. The above method further comprises, before removing the first release area, attaching a fixing tape to the second area of the flexible display panel. In the above method, the fixing tape is attached to a portion of the frame outside the flexible display panel and fixes a location of the flexible display panel. In the above method, the fixing tape is parallel to the cutting line. The above method further comprises, before removing the second release area, removing the fixing tape. In the above method, the frame comprises at least one curved portion that is convex toward the flexible display panel.

Another aspect is a method of manufacturing a curved display device, the method comprising: providing a frame comprising at least one curved portion that is convex toward an external area; attaching a release paper to a surface of a flexible display panel, the release paper comprising first and second release areas that are divided by a cutting line;

arranging the flexible display panel on the frame such that the release paper faces toward the frame; attaching a fixing tape to the flexible display panel so as to fix a location of the flexible display panel; removing the first release area; attaching a first area of the flexible display panel to the frame; removing the fixing tape and the second release area; and attaching a second area of the flexible display panel to the frame.

The above method further comprises forming a first adhesive layer over the at least one curved portion. The above method further comprises, before attaching the release paper, forming a second adhesive layer over the surface of the flexible display panel.

In the above method, the flexible display panel is attached to the frame via the first and second adhesive layers. In the above method, the fixing tape is attached to the second area. In the above method, the fixing tape is attached to a portion of the frame outside the flexible display panel and fixes a location of the flexible display panel. In the above method, the fixing tape is parallel to the cutting line.

Another aspect is a method of manufacturing a curved display device, the method comprising: providing a frame; providing a flexible display panel that has first and second areas different from each other that do not overlap each other in the depth dimension of the curved display device; attaching a release paper to a surface of the flexible display panel, the release paper comprising first and second release areas respectively corresponding to the first and second areas of the flexible display panel; attaching the first and second areas to the frame; removing the first release area from the flexible display panel before attaching the first area to the frame; and removing the second release area from the flexible display panel before attaching the second area to the frame.

In the above method, the frame comprises at least one curved portion that is convex toward the flexible display panel. The above method further comprises: forming a first adhesive layer over the frame; and forming a second adhesive layer over the surface of the flexible display panel, before attaching the release paper.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Figure 1:
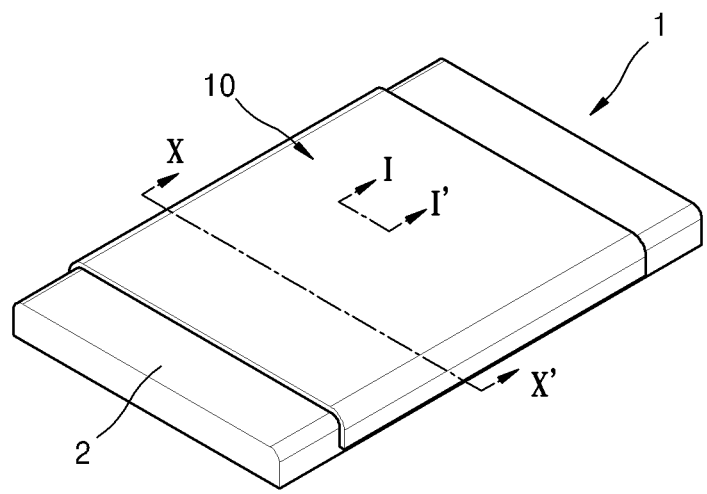
FIG. 1 is a schematic perspective view of a curved display device, according to an embodiment.

Generally, a flexible display panel, having a substrate formed of flexible materials such as plastic, is laminated on a curved cover window. However, due to the decrease in a thickness of the display panel, during the lamination process along a concave shape of the cover window, defects such as air bubbles and wrinkles can appear on the display panel.

As the inventive concept allows for various changes and numerous embodiments, particular embodiments will be illustrated in the drawings and described in the written description. The effect and features of the inventive concept and the method of realizing the effect and the features will be clear with reference to the embodiments described below with reference to the drawings. However, the inventive concept may be embodied in various forms and should not be construed as being limited to the embodiments. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

The terms used in the embodiments are selected to describe embodiments, and are not used to limit the spirit and scope of the present inventive concept. As used herein, the singular forms "a," "an" and "the" are intended to include the plural forms as well, unless the context clearly indicates otherwise. Sizes of elements in the drawings may be exaggerated for convenience of explanation. In other words, since sizes and thicknesses of components in the drawings are arbitrarily illustrated for convenience of explanation, the following embodiments are not limited thereto.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Hereinafter, embodiments will be described with reference to the drawings. In order to clearly describe the present inventive concept, elements and features that are irrelevant to the present inventive concept are omitted. Like reference numerals refer to like elements in the drawings, and thus, descriptions of similar or identical elements will not be repeated.

Figure 2:
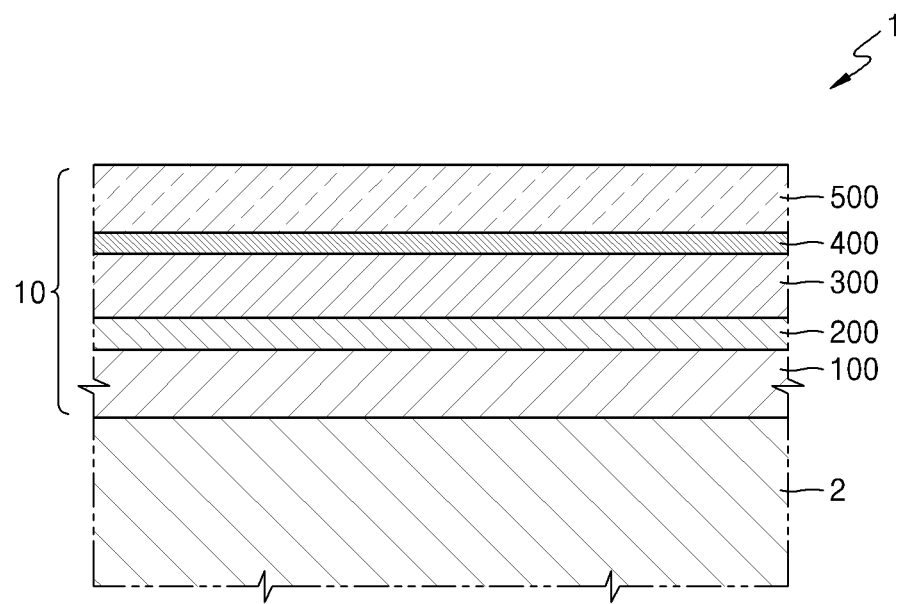
FIG. 2 is a cross-sectional view of an example of the curved display device of FIG. 1, cut along the line I-I'.
Figure 3:
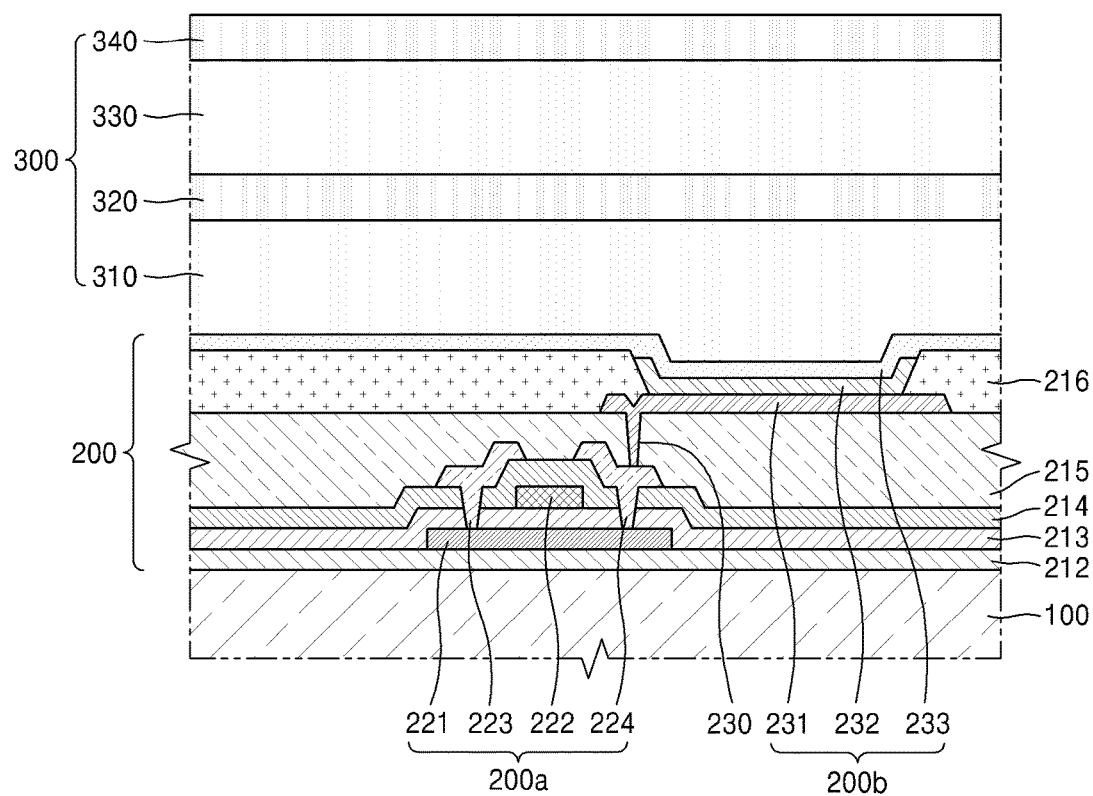
FIG. 3 is a schematic cross-sectional view of an example of a display unit and a thin film encapsulating layer of the curved display device of FIG. 2.

FIG. 1 is a schematic perspective view of a curved display device 1, according to an embodiment, FIG. 2 is a cross-sectional view of an example of the curved display device 1 of FIG. 1, cut along the line I-I', and FIG. 3 is a schematic cross-sectional view of an example of a display unit 200 and a thin film encapsulating layer 300 of the curved display device 1 of FIG. 2.

Referring to FIGS. 1 to 3, the curved display device 1 includes a frame 2 and a flexible display panel 10 attached to the frame 2.

The frame 2 is a supporting body to which the flexible display panel 10 is attached, and maintains a curved shape of the curved display device 1. The frame 2 may include a plastic material and have a shape shown in FIG. 1. Alternatively, the frame 2 may include a hollow and have a shape that is similar to the curved shape of the flexible display panel 10. The hollow of the frame 2 may include electronic components for driving the curved display device 1.

As shown in FIG. 2, the flexible display panel 10 includes a substrate 100, the display unit 200 over the substrate 100, the thin film encapsulating layer 300 sealing the display unit 200, and a function layer 400 over the thin film encapsulating layer 300. Also, a cover layer 500 may be additionally placed over the function layer 400.

The substrate 100 may include a flexible plastic material, for example, polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

When the flexible display panel 10 is a bottom-emission type panel that displays an image toward the substrate 100, the substrate 100 may include a transparent material. However, when the flexible display panel 10 is a top-emission type panel that displays an image toward the thin film encapsulating layer 300, the substrate 100 does not have to include a transparent material and may include a flexible non-transparent metal. When the substrate 100 includes a metallic material, the substrate 100 may include at least one selected from the group consisting of iron (Fe), chromium (Cr), manganese (Mn), nickel (Ni), titanium (Ti), molybdenum (Mo), stainless steel (SUS), an Invar alloy, an Inconel alloy, and a Kovar alloy. Alternatively, the substrate 100 may include metallic foil.

The display unit 200 may be placed over the substrate 100 and display an image. For example, the display unit 200 includes a thin film transistor (TFT) 200a and an organic light-emitting device (OLED) 200b. However, the described technology is not limited thereto. The display unit 200 may include various types of display devices. The display unit 200 will be described below with reference to FIG. 3.

A buffer layer 212 may be placed over the substrate 100. The buffer layer 212 may prevent impurities from penetrating through the substrate 100, and provides a flat surface above the substrate 100. The buffer layer 212 may include, for example, an inorganic material such as silicon oxide, silicon nitride, silicon oxynitride, aluminum oxide, aluminum nitride, titanium oxide, or titanium nitride, or an organic material such as polyimide, polyester, or acryl. The buffer layer 212 may include a stack of a plurality of layers of the exemplary materials above.

The TFT 200a may be placed over the substrate 100. The TFT 200a may include an active layer 221, a gate electrode 222, a source electrode 223, and a drain electrode 224.

The active layer 221 may include an inorganic semiconductor material such as silicon, or an organic semiconductor material. Also, the active layer 221 may have a source area, a drain area, and a channel area between the source and drain areas. For example, when the active layer 221 is formed by using amorphous silicon, the active layer 221 may be formed by forming an amorphous silicon layer over a top surface of the substrate 100, crystallizing and patterning the amorphous silicon layer to form a polycrystalline silicon layer, and then doping peripheral source and drain areas with impurities.

A gate insulating layer 213 is placed over the active layer 221. The gate insulating layer 213 may insulate the active layer 221 from the gate electrode 222, and include an inorganic material such as $SiN_x$ or $SiO_2$.

The gate electrode 222 is placed over an upper area of the gate insulating layer 213. The gate electrode 222 may be connected to a gate line (not shown) that applies on and off signals of the TFT 200a. The gate electrode 222 may include gold (Au), silver (Ag), copper (Cu), Ni, platinum (Pt), palladium (Pd), aluminum (Al), Mo, and a metal alloy such as Al:Nd or Mo:W. However, materials of the gate electrode 222 are not limited thereto, and the gate electrode 222 may include various materials according to manufacturing conditions.

An interlayer insulating layer 214 on the gate electrode 222 may insulate the gate electrode 222 from the source electrode 223 and the gate electrode 222 from the drain electrode 224, and may include an inorganic material such as $SiN_x$ or $SiO_2$.

The source electrode 223 and the drain electrode 224 are placed over the interlayer insulating layer 214. For example, the interlayer insulating layer 214 and the gate insulating layer 213 expose the source and drain areas of the active layer 221. Then, the source electrode 223 and the drain electrode 224 may contact the exposed source and drains areas of the active layer 221.

Each of the source electrode 223 and the drain electrode 224 may include a single layer or a plurality of layers including at least one selected from Al, Pt, Pd, Ag, magnesium (Mg), Au, Ni, neodymium (Nd), iridium (Ir), Cr, lithium (Li), calcium (Ca), Mo, Ti, tungsten (W), and Cu.

Although FIG. 3 illustrates that the TFT 200a is a top gate type which sequentially includes the active layer 221, the gate electrode 222, the source electrode 223, and the drain electrode 224, the described technology is not limited thereto. The gate electrode 222 may be under the active layer 221.

The TFT 200a may be electrically connected to the OLED 200b and apply signals for driving the OLED 200b to the OLED 200b. The TFT 200a may be covered by a planarizing layer 215 and be protected.

The planarizing layer 215 may include an inorganic insulating layer and/or an organic insulating layer. The inorganic insulating layer may include $SiO_2$, $SiN_x$, SiON, $Al_2O_3$, $TiO_2$, $Ta_2O_5$, $HfO_2$, $ZrO_2$, BST, or PZT, and the organic insulating layer may include general-use polymer (e.g., polymethyl methacrylate (PMMA), polystyrene (PS)), polymer derivatives having a phenol group, acryl-based polymer, imide-based polymer, arylether-based polymer, amide-based polymer, fluorine-based polymer, p-Xylene-based polymer, vinyl alcohol-based polymer, and a blend thereof. Alternatively, the planarizing layer 215 may include a combined stack including an inorganic insulating layer and an organic insulating layer.

The OLED 200b is placed over the planarizing layer 215. The OLED 200b includes a pixel electrode 231, an intermediate layer 232, and an opposite electrode 233.

The pixel electrode 231 is placed over the planarizing layer 215, and is electrically connected to the drain electrode 224 via a contact hole 230 formed in the planarizing layer 215.

The pixel electrode 231 may be a reflective electrode, and may include a reflection film including at least one selected from Ag, Mg, Al, Pt, Pd, Au, Ni, Nd, Ir, Cr, and a compound thereof, and a transparent or semi-transparent electrode layer on the reflection film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 that faces the pixel electrode 231 may be a transparent or semi-transparent electrode which includes a metal thin film including at least one selected from Li, Ca, LiF/Ca, LiF/Al, Al, Ag, Mg, and a compound thereof having a low work function. Also, an auxiliary electrode layer or a bus electrode may be additionally placed over the metal thin film as a material for forming a transparent electrode such as ITO, IZO, ZnO, or $In_2O_3$.

Therefore, the opposite electrode 233 may transmit light that is emitted by an organic emission layer (not shown) included in the intermediate layer 232. That is, light emitted by the organic emission layer may be transmitted toward the opposite electrode 233 directly or by being reflected by the pixel electrode 231 that is a reflective electrode.

However, the display unit 200 according to the present embodiment is not limited to a top-emission type. The display unit 200 may be a bottom-emission type in which light emitted by the organic emission layer is transmitted toward the substrate 100. In this case, the pixel electrode 231 may be a transparent or semi-transparent electrode, and the opposite electrode 233 may be a reflective electrode. Alternatively, the display unit 200 according to the present embodiment may be a dual-emission type that emits light toward a top side and a bottom side thereof.

A pixel-defining layer 216 may be placed over the pixel electrode 231 as an insulating material. The pixel-defining layer 216 may be formed by using a method such as spin coating with at least one organic insulating material selected from the group consisting of polyimide, polyamide, acryl resin, benzocyclobutene, and phenol resin. The pixel-defining layer 216 may expose an area of the pixel electrode 231, and the intermediate layer 232 including the organic emission layer may be on the exposed area of the pixel electrode 231.

The organic emission layer in the intermediate layer 232 may include a low molecular organic material or a high molecular organic material, and the intermediate layer 232 may include the organic emission layer and may further selectively include a function layer such as a hole transport layer (HTL), a hole injection layer (HIL), an electron transport layer (ETL), and an electron injection layer (EIL).

The thin film encapsulating layer 300 is placed over the opposite electrode 233. The thin film encapsulating layer 300 may completely cover the display unit 200 so that external moisture and oxygen are prevented from penetrating into the display unit 200. The thin film encapsulating layer 300 may be larger than the display unit 200 such that all edges of the thin film encapsulating layer 300 contact the substrate 100, and thus, penetration of external air may be totally blocked.

The thin film encapsulating layer 300 may include at least one organic layer and at least one inorganic layer. The at least one organic layer and the at least one inorganic layer may be alternately stacked on one another. Although FIG. 3 illustrates an example in which the thin film encapsulating layer 300 includes two inorganic layers 320 and 340 and two organic layers 310 and 330, the embodiments are not limited thereto. That is, the thin film encapsulating layer 300 may additionally include alternately arranged inorganic layers and organic layers. The number of stacked inorganic and organic layers is not limited to a certain number.

The inorganic layers 320 and 340 may include at least one selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The organic layers 310 and 330 may planarize a level difference caused by the pixel-defining layer 216 and reduce stress on the inorganic layer 320. Also, the organic layers 310 and 330 may provide a flat surface even when particles are on the inorganic layer 320.

The inorganic layers 320 and 340 may be larger than the organic layers 310 and 330. Therefore, the inorganic layers 320 and 340 may contact each other at outer peripheries of the organic layers 310 and 330, and thus, external oxygen or moisture may be blocked more effectively.

The function layer 400 is placed over the thin film encapsulating layer 300.

The function layer 400 may include at least one of a polarization layer and a touch screen layer. Also, the function layer 400 may include an optical film for reflecting external light.

The polarization layer may transmit light emitted by the display unit 200, but only light that vibrates in the same direction as a polarization axis and absorb or reflect light that vibrates in any other direction. The polarization layer may include a retardation film that transforms linearly polarized light into circularly polarized light or vice versa by retarding two perpendicular polarized components by $\lambda/4$, and a polarization film that arranges directions of light transmitted through the retardation film, divides transmitted light into two perpendicular polarized components, and transmits one of the components but absorbs or scatters the other component.

The touch screen layer may include a touch sensor in which a first electrode and a second electrode are alternately arranged. The touch sensor may be, for example, a capacitance type touch sensor that detects variation of capacitance generated in first and second alternately arranged electrodes and determines whether there is contact on an area.

The cover layer 500 on the function layer 400 may protect the curved display device 1 from external shock and scratches during use. The cover layer 500 may include PMMA, polydimethylsiloxane, polyimide, acrylate, polyethylene terephthalate, or polyethylene naphthalate. However, materials of the cover layer 500 are not limited thereto. The cover layer 500 may include a metallic material, and in some cases, a thin metal foil such as SUS.

FIGS. 4 to 8 are schematic diagrams for describing a method of manufacturing the curved display device of FIG. 1. For convenience of description, FIGS. 4, 5, 7, and 8 show cross-sectional views of the curved display device of FIG. 1, cut along the line X-X'.

Referring to FIGS. 4 to 8, the method of manufacturing the curved display device 1 includes preparing the frame 2, preparing the flexible display panel 10, arranging the flexible display panel 10 on the frame 2, and attaching the flexible display panel 10 to the frame 2.

Figure 4:
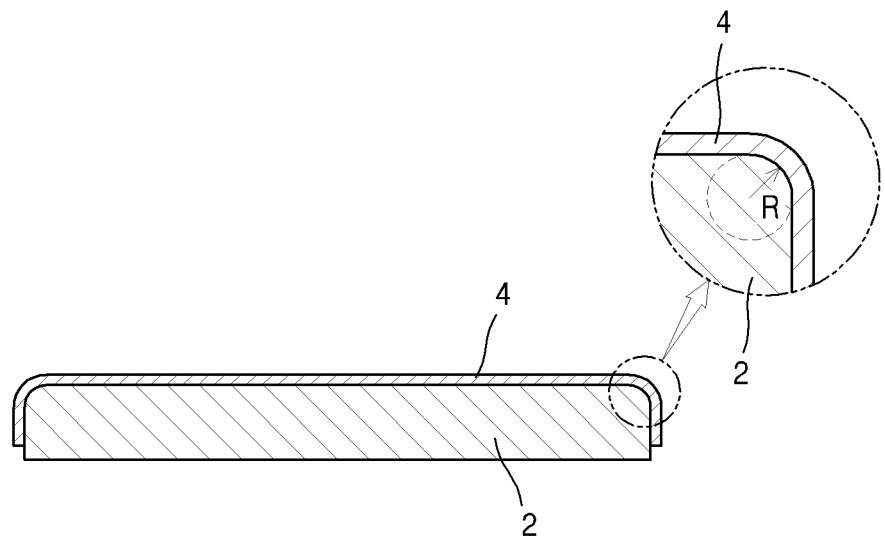
FIGS. 4 to 8 are schematic diagrams for describing a method of manufacturing the curved display device of FIG. 1.

The preparing of the frame 2 includes forming a first adhesive layer 4 on the frame 2, as shown in FIG. 4.

The frame 2 may be formed by injection molding. The frame 2 may include at least one curved portion that is convex toward an outer area. The curved portion may have a radius of curvature R of about 1 mm or less.

The first adhesive layer 4 may be formed by placing an adhesive film on the frame 2 and laminating the adhesive film. Adhesion strength of the first adhesive layer 4 may range from about 500 gf/inch to about 5000 gf/inch, but is not limited thereto.

The flexible display panel 10 may be the same as that described with reference to FIGS. 2 and 3. The preparing of the flexible display panel 10 may include sequentially forming a second adhesive layer 20 and a release film 30 on a surface of the flexible display panel 10.

The second adhesive layer 20 may be formed by fixing the flexible display panel 10 on a flat zig, and laminating an adhesive film on a surface of the flexible display panel 10. Adhesion strength of the second adhesive layer 20 may range from about 500 gf/inch to about 5000 gf/inch, but is not limited thereto.

When the flexible display panel 10 is arranged on the frame 2, the release paper 30 may prevent the flexible display panel 10 from being attached to a random area of the frame 2 by the first adhesive layer 4.

The release paper 30 may include a first release area 31 and a second release area 33 that are divided by a cutting line CL. The first release area 31 and the second release area 33 may be formed by attaching the release paper 30 on the flexible display panel 10 and cutting the release paper 30. Alternatively, the release paper 30 attached on the flexible display panel 10 may include the first release area 31 and the second release area 33 that are separated.

Based on the cutting line CL that divides the first and second release areas 31 and the second release area 33, the flexible display panel 10 on which the release paper 30 is attached may be defined as a first area S1 corresponding to the first release area 31 and a second area S2 corresponding to the second release area 33.

Figure 5:
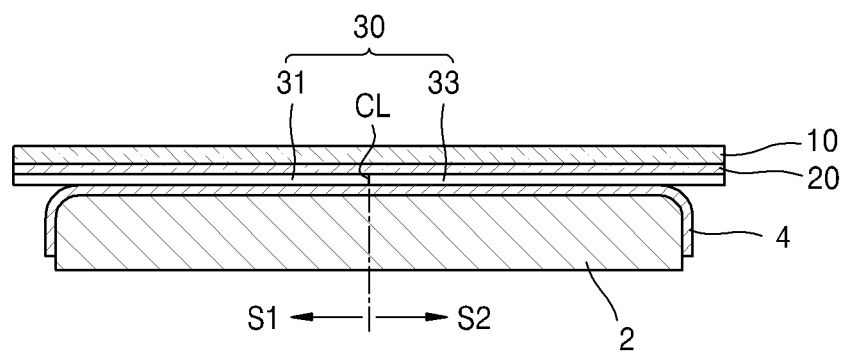
Figure 6:
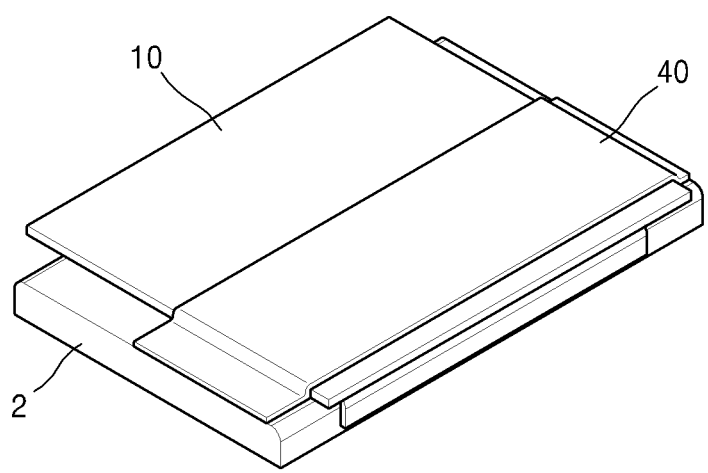

As shown in FIGS. 5 and 6, the release paper 30 may be arranged on the frame 2 toward the frame 2 and fixed by a fixing tape 40.

The fixing tape 40 may be attached to a portion of the flexible display panel 10. For example, the first area S1 and the second area S2 of the flexible display panel 10 may be sequentially attached on the frame 2. The fixing tape 40 may be attached on the second area S2 that is attached after the first area S1.

The fixing tape 40 may extend in substantially parallel to the cutting line CL. The fixing tape 40 may be attached from an external area of the flexible display panel 10 to the frame 2 and may fix a location of the flexible display panel 10 while the first area S1 is attached to the frame 2. Since the fixing tape 40 may be removed before the second area S2 is attached to the frame 2, adhesion strength of the fixing tape 40 may be weaker than those of the first and second adhesive layers 4 and 20. For example, the adhesion strength of the fixing tape 40 may be about 500 gf/inch or less, but is not limited thereto.

The attaching of the flexible display panel 10 may include, first, attaching the first area S1 on the frame 2, and then attaching the second area S2 on the frame 2.

Figure 7:
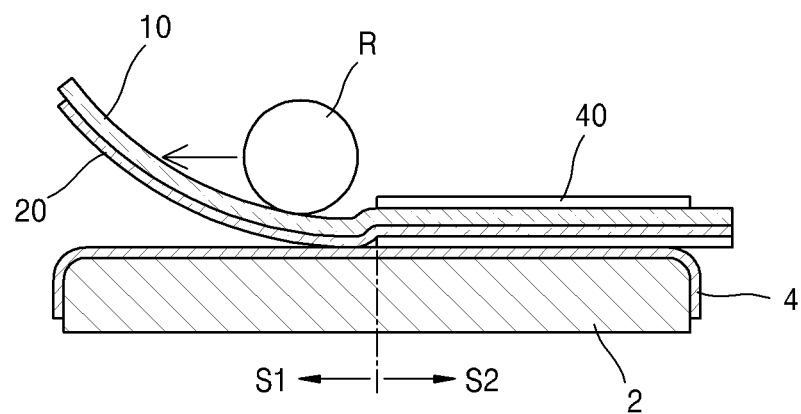

First, as shown in FIG. 7, after attaching the fixing tape 40, the first release area 31 may be removed from the flexible display panel 10, and then the first area S1 may be attached on the frame 2 by performing lamination.

The second adhesive layer 20 in the first area S1 may be exposed by removing the first release area 31. Then, the second adhesive layer 20 may be attached to the first adhesive layer 4 by moving a roller R from the cutting line CL toward an outer area. In this case, the location of the flexible display panel 10 is fixed because the fixing tape 40 is attached on the second area S2. Accordingly, the flexible display panel 10 may firmly maintain its location during lamination.

Figure 8:
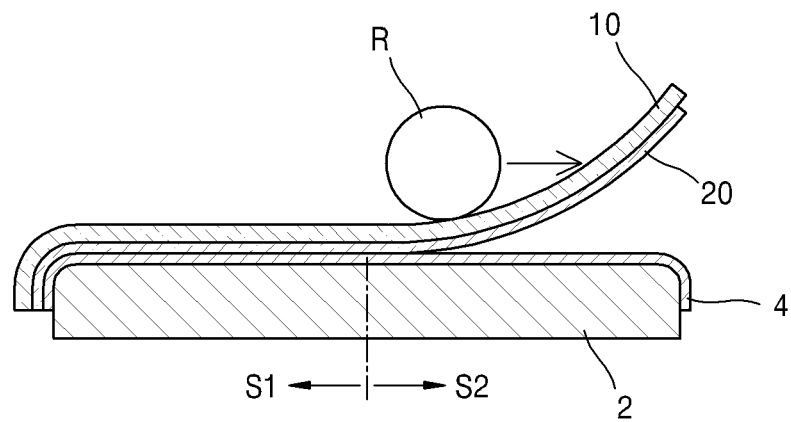

Next, as shown in FIG. 8, the second area S2 is attached on the frame 2 by laminating the flexible display panel 10. The second area S2 may be attached to the frame 2 by being laminated according to the movement of the roller R after removing the fixing tape 40 and the second release area 33. In this case, since the first area S1 is attached to the frame 2, the flexible display panel 10 may firmly maintain its location during lamination of the second area S2.

As described above, since the frame 2 includes the curved portion having a small radius of curvature of 1 mm or less, the flexible display panel 10 attached to the frame 2 may be curved to have the small radius of curvature as that of the frame 2, and thus, the flexible display panel 10 may be thin. For example, the flexible display panel 10 may be formed to about 150 μm or less such that the flexible display panel 10 is attached to the curved portion without being damaged.

When the flexible display panel 10 is thin, the flexible display panel 10 may have defects such as wrinkles due to air bubbles formed during lamination or shifting of the location of the flexible display panel 10. However, as described above, when the flexible display panel 10 is fixed by using the fixing tape 40 and then the first area S1 and the second area S2 are sequentially laminated, the location of the flexible display panel 10 is not shifted, a moving distance of the roller R decreases, and the roller R moves along the convex shape. Therefore, even when the flexible display panel 10 is thin, the defects on the flexible display panel 10 may be prevented.

While the inventive technology has been described with reference to embodiments, it will be understood by those of ordinary skill in the art that various changes in form and details may be made therein without departing from the spirit and scope as defined by the following claims.

What is claimed is:

1. A method of manufacturing a curved display device, the method comprising:
   providing a frame;
   providing a flexible display panel that includes a driving circuit configured to generate an image;
   attaching a first area of the flexible display panel to the frame by laminating;
   attaching a second area of the flexible display panel to the frame by laminating, wherein the providing of the flexible display panel comprises attaching a release paper to a surface of the flexible display panel, the release paper comprising first and second release areas respectively corresponding to the first and second areas of the flexible display panel;
   removing the first release area from the flexible display panel before attaching the first area; and
   removing the second release area from the flexible display panel before attaching the second area,
   wherein the first and second release areas are divided by a cutting line.

2. The method of claim 1, wherein the providing of the frame comprises forming a first adhesive layer over the frame.

3. The method of claim 2, wherein the providing of the flexible display panel comprises, before attaching the release paper, forming a second adhesive layer over the surface of the flexible display panel.

4. The method of claim 3, wherein the flexible display panel is attached to the frame via the first and second adhesive layers.

5. The method of claim 1, further comprising, before removing the first release area, attaching a fixing tape to the second area of the flexible display panel.

6. The method of claim 5, wherein the fixing tape is attached to a portion of the frame outside the flexible display panel and fixes a location of the flexible display panel.

7. The method of claim 6, wherein the fixing tape is parallel to the cutting line.

8. The method of claim 5, further comprising, before removing the second release area, removing the fixing tape.

9. The method of claim 1, wherein the frame comprises at least one curved portion that is convex toward the flexible display panel.

10. A method of manufacturing a curved display device, the method comprising:
    providing a frame comprising at least one curved portion that is convex toward an external area;

attaching a release paper to a surface of a flexible display panel that includes a driving circuit configured to generate an image, the release paper comprising first and second release areas that are divided by a cutting line;

arranging the flexible display panel on the frame such that the release paper faces toward the frame;

attaching a fixing tape to the flexible display panel so as to fix a location of the flexible display panel;

removing the first release area;

attaching a first area of the flexible display panel to the frame by laminating;

removing the fixing tape and the second release area; and attaching a second area of the flexible display panel to the frame by laminating.

11. The method of claim 10, further comprising forming a first adhesive layer over the at least one curved portion.

12. The method of claim 11, further comprising, before attaching the release paper, forming a second adhesive layer over the surface of the flexible display panel.

13. The method of claim 12, wherein the flexible display panel is attached to the frame via the first and second adhesive layers.

14. The method of claim 10, wherein the fixing tape is attached to the second area.

15. The method of claim 14, wherein the fixing tape is attached to a portion of the frame outside the flexible display panel and fixes a location of the flexible display panel.

16. The method of claim 14, wherein the fixing tape is parallel to the cutting line.

17. A method of manufacturing a curved display device, the method comprising:

providing a frame;

providing a flexible display panel that has first and second areas different from each other that do not overlap each other in the depth dimension of the curved display device, wherein the flexible display panel includes a driving circuit configured to generate an image;

attaching a release paper to a surface of the flexible display panel, the release paper comprising first and second release areas respectively corresponding to the first and second areas of the flexible display panel;

attaching the first and second areas to the frame by laminating;

removing the first release area from the flexible display panel before attaching the first area to the frame; and removing the second release area from the flexible display panel before attaching the second area to the frame, wherein the first and second release areas are divided by a cutting line.

18. The method of claim 17, wherein the frame comprises at least one curved portion that is convex toward the flexible display panel.

19. The method of claim 17, further comprising:

forming a first adhesive layer over the frame; and forming a second adhesive layer over the surface of the flexible display panel, before attaching the release paper.

20. The method of claim 1, wherein each of the first and second areas of the flexible display panel is configured to generate an image.

21. The method of claim 1, wherein the first and second areas of the release paper are integrally formed such that the release paper is configured as a single release paper.

* * * * *